(12) United States Patent
Pelella et al.

(10) Patent No.: US 7,465,639 B1
(45) Date of Patent: Dec. 16, 2008

(54) METHOD FOR FABRICATING AN SOI DEVICE

(75) Inventors: Mario M. Pelella, Mountain View, CA (US); Richard K. Klein, Mountain View, CA (US); James Werking, Danbury, CT (US)

(73) Assignee: Advanced Micro Devices, Inc., Austin, TX (US)

( * ) Notice: Subject to any disclaimer, the term of this patent is extended or adjusted under 35 U.S.C. 154(b) by 719 days.

(21) Appl. No.: 11/133,969

(22) Filed: May 20, 2005

(51) Int. Cl.
*H01L 21/20* (2006.01)
(52) U.S. Cl. ..................................................... 438/384
(58) Field of Classification Search ......... 438/384–386, 438/622, 626; 257/532–535
See application file for complete search history.

(56) References Cited

U.S. PATENT DOCUMENTS 4,737,830 A    4/1988   Patel et al.
6,387,770 B2 *  5/2002  Roy ........................... 438/384
7,282,404 B2 * 10/2007  Coolbaugh et al. .......... 438/239
2002/0192919 A1 * 12/2002 Bothra ....................... 438/381

* cited by examiner

*Primary Examiner*—Calvin Lee
(74) *Attorney, Agent, or Firm*—Ingrassia Fisher & Lorenz, P.C.

(57) ABSTRACT

A method is provided for fabricating a silicon on insulator (SOI) device that includes a silicon substrate, a buried insulator layer overlying the silicon substrate, and a monocrystalline silicon layer overlying the buried insulator layer. The method comprises the steps of forming an MOS capacitor coupled between a first voltage bus and a second voltage bus. The MOS capacitor has a gate electrode material forming a first plate of the MOS capacitor and an impurity doped region in the monocrystalline silicon layer beneath the gate electrode material forming a second plate of the MOS capacitor. The first voltage bus is coupled to the first plate of the capacitor and the second voltage bus is coupled to the second plate of the capacitor. The method further includes forming an electrical discharge path coupling the second plate of the MOS capacitor to the silicon substrate.

19 Claims, 8 Drawing Sheets

METHOD FOR FABRICATING AN SOI DEVICE

TECHNICAL FIELD

The present invention generally relates to methods for fabricating silicon on insulator (SOI) devices and more particularly to methods for fabricating SOI devices including a discharge path for a decoupling capacitor.

BACKGROUND

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs and the IC is then referred to as a complementary MOS or CMOS circuit. Certain improvements in performance of FET ICs can be realized by forming the FETs in a thin layer of semiconductor material overlying an insulator layer. Such semiconductor on insulator (SOI) FETs, for example, exhibit lower junction capacitance and hence can operate at higher speeds.

The MOS transistors formed in and on the SOI layer are interconnected to implement the desired circuit function. A number of voltage busses are also connected to appropriate devices to power those devices as required by the circuit function. The voltage busses may include, for example, a $V_{dd}$ bus, a $V_{cc}$ bus, a $V_{ss}$ bus, and the like, and may include busses coupled to external power sources as well as busses coupled to internally generated or internally altered power sources. As used herein, the terms will apply to external as well as internal busses. As various nodes in the circuit are either charged or discharged during the operation of the circuit, the various busses must source or sink current to those nodes. Especially as the switching speed of the integrated circuits increases, the requirement of sourcing or sinking current by a bus can cause significant voltage spikes on the bus because of the inherent inductance of the bus. To avoid logic errors that might be caused by the voltage spikes, it has become commonplace to place decoupling capacitors between the busses. For example, such decoupling capacitors can be connected between the $V_{dd}$ and $V_{ss}$ busses. These decoupling capacitors are typically distributed along the length of the busses. The capacitors are usually formed as MOS capacitors with one plate of the capacitor formed by the same material used to form the gate electrode of the MOS transistors, the other plate of the capacitor formed by an impurity doped region in the SOI layer, and the dielectric separating the two plates of the capacitor formed by the gate dielectric.

One problem that can affect the yield and reliability of the integrated circuit can occur when using such MOS capacitors as the decoupling capacitors between two different voltage busses. The problem occurs because sufficient charge can build up on the capacitor to cause a destructive discharge through the capacitor dielectric material. This problem becomes more severe as device sizes shrink and especially as the thickness of the gate dielectric layer is reduced. The ability of the capacitor dielectric to withstand a charge build up is reduced as the thickness of the dielectric layer is reduced. The charge build up results from one or more of the plasma etching steps that are used to etch the interlayer dielectric materials and the metals used in the final steps in fabricating the integrated circuits.

Accordingly, it is desirable to provide a method for fabricating MOS devices that avoids the destructive effects of charge build up on decoupling capacitors. In addition, it is desirable to provide a method for fabricating an SOI device that incorporates decoupling capacitors. Furthermore, other desirable features and characteristics of the present invention will become apparent from the subsequent detailed description and the appended claims, taken in conjunction with the accompanying drawings and the foregoing technical field and background.

BRIEF SUMMARY

A method is provided for fabricating a silicon on insulator (SOI) device that includes a silicon substrate, a buried insulator layer overlying the silicon substrate, and a monocrystalline silicon layer overlying the buried insulator layer. In accordance with one embodiment of the invention the method comprises the steps of forming an MOS capacitor coupled between a first voltage bus and a second voltage bus. The MOS capacitor has a gate electrode material forming a first plate of the MOS capacitor and an impurity doped region in the monocrystalline silicon layer beneath the gate electrode material forming a second plate of the MOS capacitor. The first voltage bus is coupled to the first plate of the capacitor and the second voltage bus is coupled to the second plate of the capacitor. The method further includes forming an electrical discharge path coupling the second plate of the MOS capacitor to the silicon substrate.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
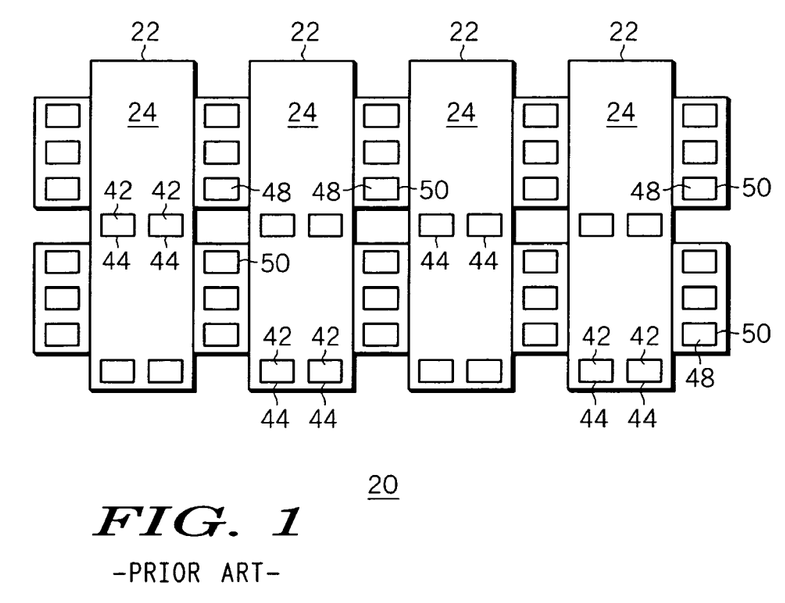
FIG. 1 illustrates, in plan view, a conventional decoupling capacitor structure.
Figure 2:
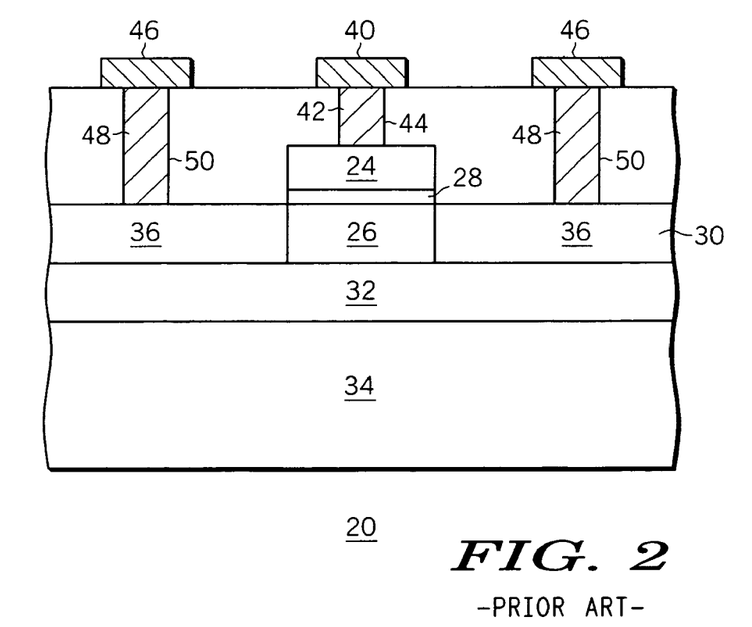
FIG. 2 illustrates, in cross section, a portion of the decoupling capacitor of FIG. 1.

FIGS. 1 and 2 illustrate, in plan view and partial cross section, respectively, elements of a conventional decoupling capacitor structure 20 implemented in a portion of a silicon on insulator (SOI) integrated circuit (IC) device structure. Structure 20 includes a plurality of distributed MOS capacitors 22, each of which includes a top plate 24, a bottom plate 26 and a capacitor dielectric 28. Top plate 24 is formed from the same material as are the gate electrodes of the MOS transistor that make up the remainder of the IC. Capacitor dielectric 28 is formed of the same material used for the gate dielectric of the MOS transistors of the IC. Bottom plate 26 is formed of a thin layer 30 of silicon that overlies insulator 32 that, in turn, overlies semiconductor substrate 34. In this exemplary illustration layer 30 of silicon is doped N-type. Heavily doped N+ contacts 36, formed in self alignment with top plates 24, facilitate Ohmic contact to layer 30. An interlayer dielectric 38 overlies the capacitor structures and electrically isolates the capacitors from other layers of metallization that may be used to interconnect devices of the IC. A bus such as a $V_{dd}$ bus 40 (not illustrated in FIG. 1) is coupled to top plates 24 by metallized contacts 42 formed in openings 44 through interlayer dielectric 38. A bus such as a $V_{ss}$ bus 46 (not illustrated in FIG. 1) is coupled to bottom plate 26 by metallized contacts 48 formed in openings 50 through interlayer dielectric 38 and contacting N+ contacts 36. For each of the busses, a plurality of metallized contacts is used to insure good contact between the bus and the respective plate of the capacitor. Also, a plurality of capacitor structures is coupled between the two busses, and such capacitor structures will be found distributed about the integrated circuit.

FIGS. 3-8 illustrate, in cross section, method steps for forming a portion of a decoupling capacitor 52 as part of a silicon on insulator CMOS integrated circuit 53 in accordance with an embodiment of the invention. In accordance with an embodiment of the invention, explained more fully below, decoupling capacitor 52 includes a discharge path by which charge that builds up on the capacitor during processing can be safely discharged to avoid destruction of the capacitor dielectric. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of CMOS integrated circuit 53 is illustrated, specifically the portion of the circuit in which decoupling capacitor 52 is formed in addition to one N-channel MOS transistor (NMOS transistor) and one P-channel MOS transistor (PMOS transistor). Various steps in the manufacture of CMOS devices are well known and so, in the interest of brevity, many conventional steps will only be mentioned briefly herein or will be omitted entirely without providing the well known process details. Although in this illustrative embodiment the integrated circuit is described as a CMOS circuit, the invention is also applicable to the fabrication of a single channel type MOS circuit.

Figure 3:
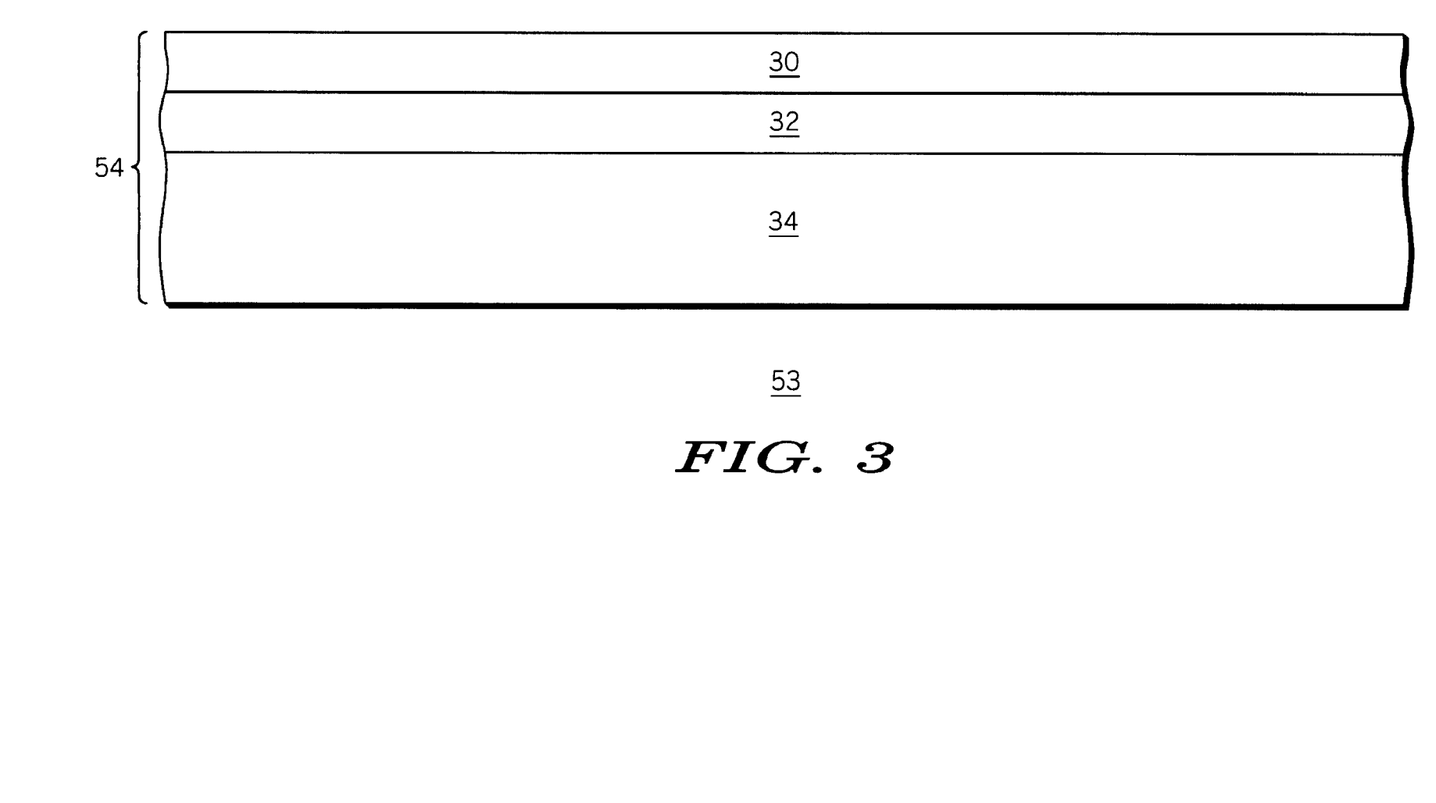
FIGS. 3-8 illustrate, in cross section, method steps for fabricating an SOI integrated circuit in accordance with various embodiments of the invention.

As illustrated in FIG. 3, the method in accordance with one embodiment of the invention begins by providing a semiconductor substrate 54. The semiconductor substrate is preferably a silicon substrate with a monocrystalline silicon layer 30 formed overlying a monocrystalline silicon carrier substrate 34. As used herein, the terms "silicon layer" and "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. Monocrystalline silicon layer 30 will be used in the formation of N-channel and P-channel MOS transistors as well as decoupling capacitor 52. Monocrystalline silicon substrate 34 provides a support for monocrystalline silicon layer 30 and, in accordance with an embodiment of the invention, will be used for the formation of one portion of decoupling capacitor 52. Monocrystalline silicon layer 30 is bonded to monocrystalline silicon carrier substrate 34 by well known wafer bonding and thinning techniques with a dielectric insulating layer 32 separating monocrystalline silicon layer 30 from monocrystalline carrier substrate 34. The monocrystalline silicon layer is thinned to a thickness of about 50-300 nanometers (nm) depending on the circuit function being implemented. Both the monocrystalline silicon layer and the monocrystalline silicon carrier substrate preferably have a resistivity of at least about 1-35 Ohms per square. In accordance with one embodiment of the invention thin silicon layer 30 is impurity doped N-type and monocrystalline carrier substrate 34 is impurity doped P-type. Dielectric insulating layer 32, typically silicon dioxide, preferably has a thickness of about 50-200 nm.

As one alternative to the wafer bonding technique, monocrystalline semiconductor substrate 54 can be formed by the SIMOX process. The SIMOX process is a well known process in which oxygen ions are implanted into a sub-surface region of monocrystalline silicon substrate 34. The monocrystalline silicon substrate and the implanted oxygen are subsequently heated to form a sub-surface silicon oxide dielectric layer 32 that electrically isolates the upper portion of the substrate, SOI layer 30, from the remaining portion of monocrystalline silicon substrate 34. The thickness of SOI layer 30 is determined by the energy of the implanted ions. Regardless of the method used to form the SOI layer, dielectric layer 32 is commonly referred to as a buried oxide or "BOX" and will so be referred to herein.

Figure 4:
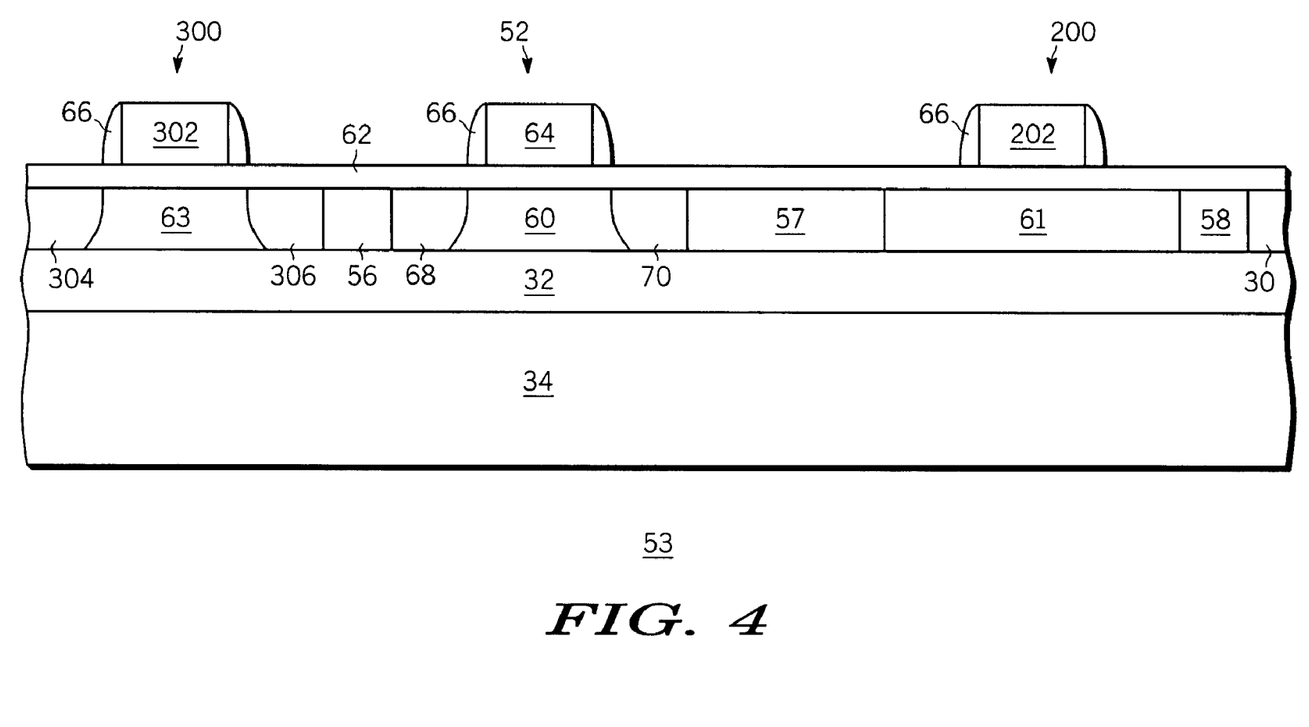

Having provided a semiconductor substrate 54, the method in accordance with one embodiment of the invention continues as illustrated in FIG. 4 by the formation of dielectric isolation regions 56-58 extending through monocrystalline silicon layer 30 to dielectric layer or BOX 32. The dielectric isolation regions are preferably formed by the well known shallow trench isolation (STI) technique in which trenches are etched into monocrystalline silicon layer 30, the trenches are filled with a dielectric material such as deposited silicon dioxide, and the excess silicon dioxide is removed by CMP. In this illustrative example, only a single N-channel MOS transistor, a single P-channel MOS transistor, and a single decoupling capacitor will be illustrated. Those of skill in the art will appreciate that many other devices may be needed to implement a desired circuit function. Accordingly, additional STI regions (not illustrated) can be formed to provide electrical isolation, as needed, between the various other devices of the CMOS circuit that is to be formed in and on monocrystalline silicon layer 30.

In accordance with an embodiment of the invention, the portion 60 of thin monocrystalline silicon layer 30 between dielectric isolation regions 56 and 57 can be doped N-type. The N-type doing can be the original doping of layer 30, or can be subsequent doping by ion implantation or the like. Portion 60 of the thin monocrystalline silicon layer 30 forms the bottom plate of decoupling capacitor 52. In like manner, portion 61 of thin monocrystalline silicon layer 30 between dielectric isolation regions 57 and 58 can also be doped N-type. Portion 61 will be used for the formation of a P-channel transistor 200. Portion 63 of layer 30 adjacent dielectric isolation region 56 can be doped P-type, for example by ion implantation. Portion 63 will be used for the formation of an N-channel transistor 300. As illustrated in FIG. 4, a layer of dielectric material 62 is formed at least on the surface of portion 60, portion 61, and portion 63 of the SOI layer. Dielectric material 62 preferably has a thickness of about 1-3 nm and most preferably has a thickness of about 1.5-2.0 nm. Dielectric material 62 forms the gate insulator of P-channel transistor 200, N-channel transistor 300, and the capacitor dielectric of capacitor 52. It is not necessary that layer 62 be used for all three devices; that is, one dielectric layer could be used for the capacitor dielectric and a different dielectric layer could be used for the gate insulator of transistors 200 and 300, but using layer 62 for all three devices helps to minimize the number of method steps. The dielectric material can be thermally grown silicon dioxide or can be a deposited layer of silicon oxide, silicon oxynitride, silicon nitride, or a high dielectric constant dielectric such as HfSiO, or the like. Deposited insulators can be deposited by chemical vapor deposition (CVD), low pressure chemical vapor deposition (LPCVD), or plasma enhanced chemical vapor deposition (PECVD). As illustrated, layer 62 is a deposited layer that deposits on the dielectric isolation regions as well as on the thin silicon layer 30. A layer of polycrystalline silicon or other gate electrode forming material is deposited onto the layer of dielectric material and is patterned to form a top plate 64 of decoupling capacitor 52, a gate electrode 202 of P-channel MOS transistor 200, and a gate electrode 302 of N-channel MOS transistor 300. The gate electrode forming material will hereinafter be referred to as polycrystalline silicon although those of skill in the art will recognize that other materials can also be used. The polycrystalline silicon can be deposited by CVD or LPCVD by the reduction of silane ($SiH_4$). In a preferred embodiment of the invention, sidewall spacers 66 can be formed on the edges of top plate 64, gate electrode 202, and gate electrode 302. The sidewall spacers can be formed by anisotropically etching a layer of silicon oxide, silicon nitride, or the like in well known manner. As also illustrated in FIG. 4, contact regions 68, 70 are formed in self alignment with top plate 64 by ion implanting N-type conductivity determining dopant impurities into portion 60 of thin monocrystalline silicon layer 30 using top plate 64 and sidewall spacers 66 as ion implantation masks. The N-type conductivity determining dopant impurities can be either arsenic or phosphorus. The heavily doped (N+) contact regions facilitate good electrical contact to the bottom plate of the decoupling capacitor. At the same time that contact regions 68, 70 are being ion implanted, the same implantation can be used to implant the drain 304 and source 306 regions of N-channel MOS transistor 300. During the N-type ion implantation, P-channel MOS transistor 200 and other regions of the integrated circuit can be masked in known manner, for example with a layer of photoresist.

Figure 5:
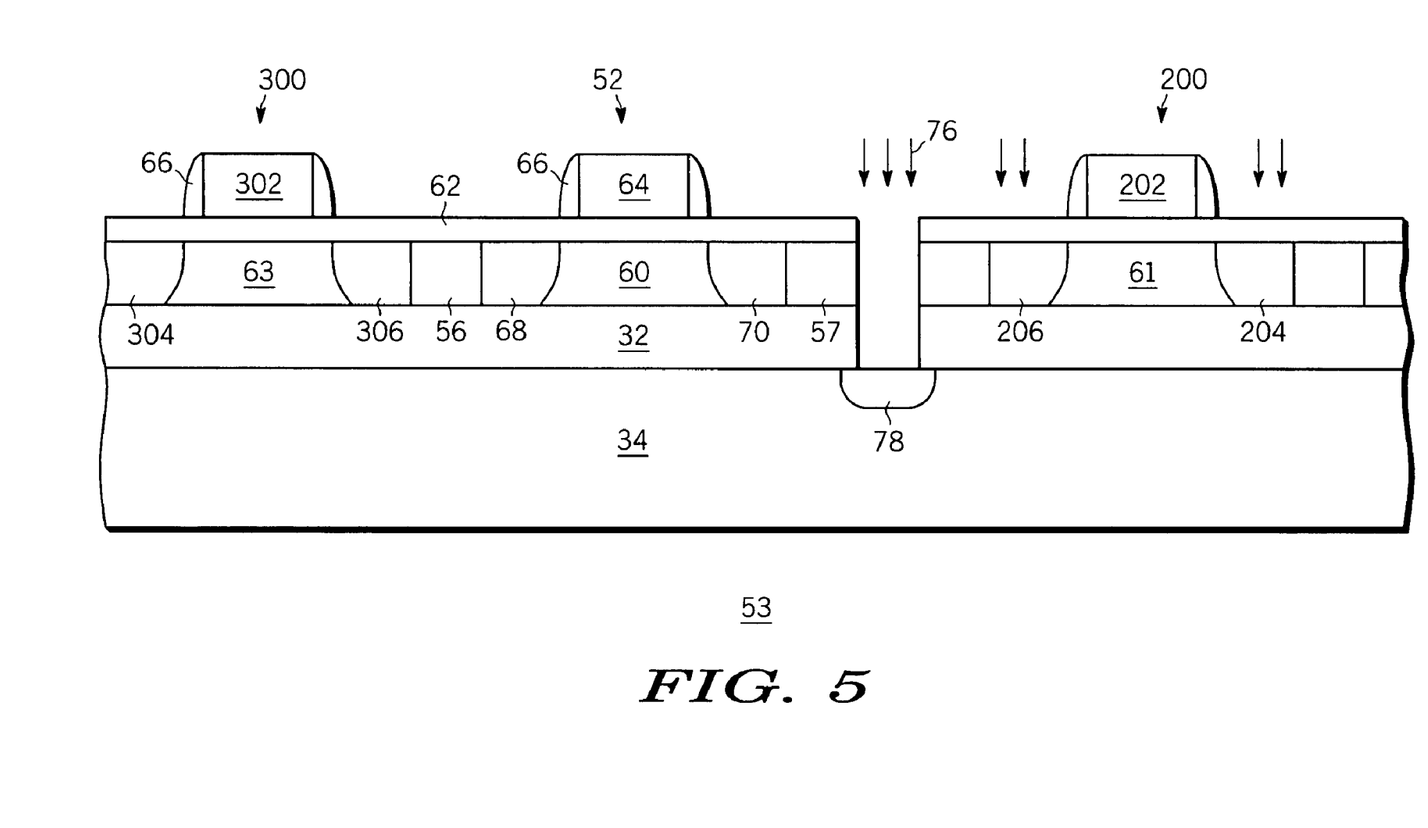

As illustrated in FIG. 5, an opening 74 is etched through a portion of dielectric isolation region 57 and the underlying dielectric layer 32. Opening 74 is anisotropically etched, preferably by reactive ion etching. The dielectric layers can be reactive ion etched, for example, using a $CF_4$ or $CHF_3$ chemistry. Opening 74 exposes a portion of the surface of monocrystalline silicon carrier substrate 34. The etching can be masked, for example, by a patterned layer of photoresist (not illustrated).

As also illustrated in FIG. 5, boron ions or other P-type conductivity determining ions are implanted through opening 74, as indicated by arrows 76, into monocrystalline silicon carrier substrate 34 to form a contact region 78 in the carrier substrate. The same boron ion implantation can also be used to form the source 204 and drain 206 regions of P-channel MOS transistor 200 of integrated circuit 53. Other devices can be masked during the P-type ion implantation by a patterned layer of photoresist (not illustrated).

Figure 6:
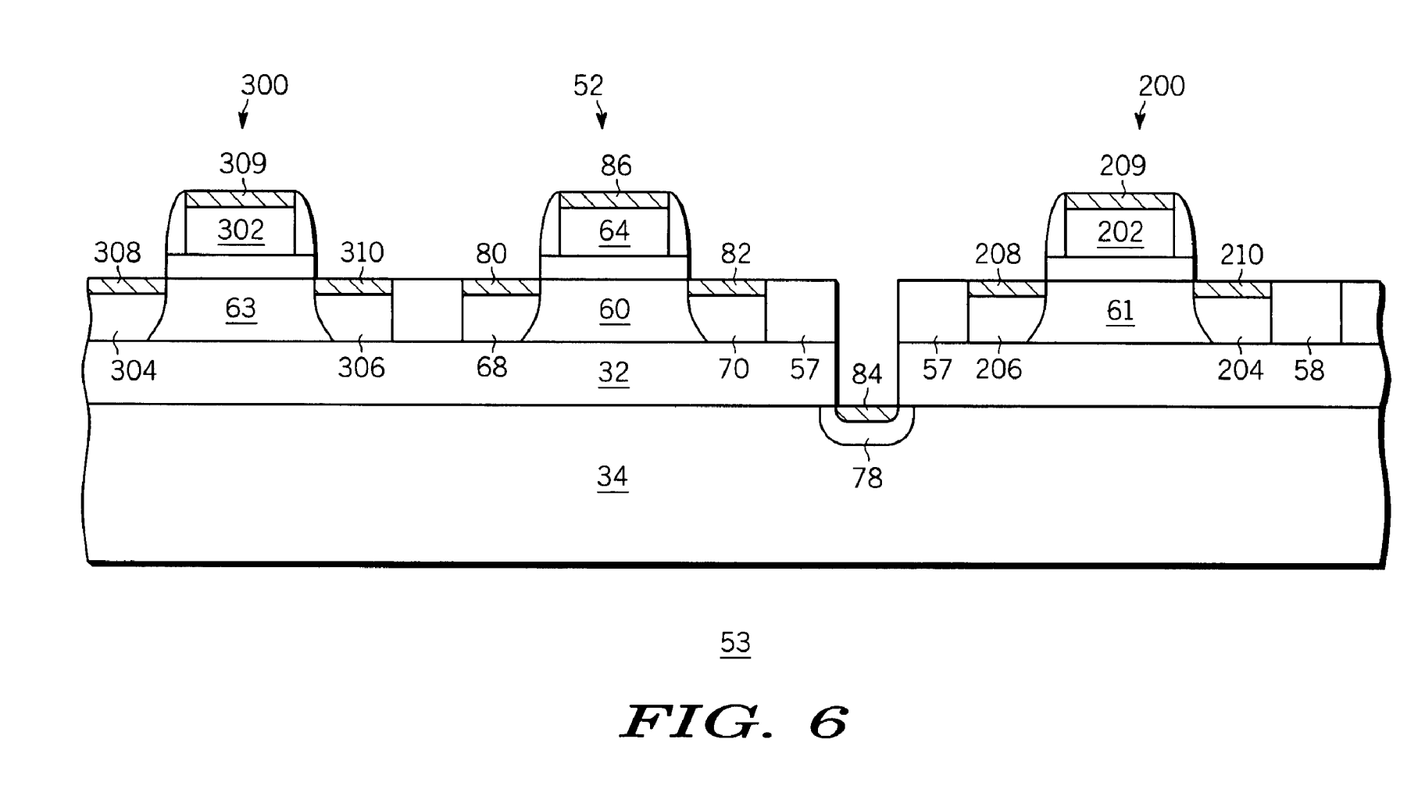
Figure 7:
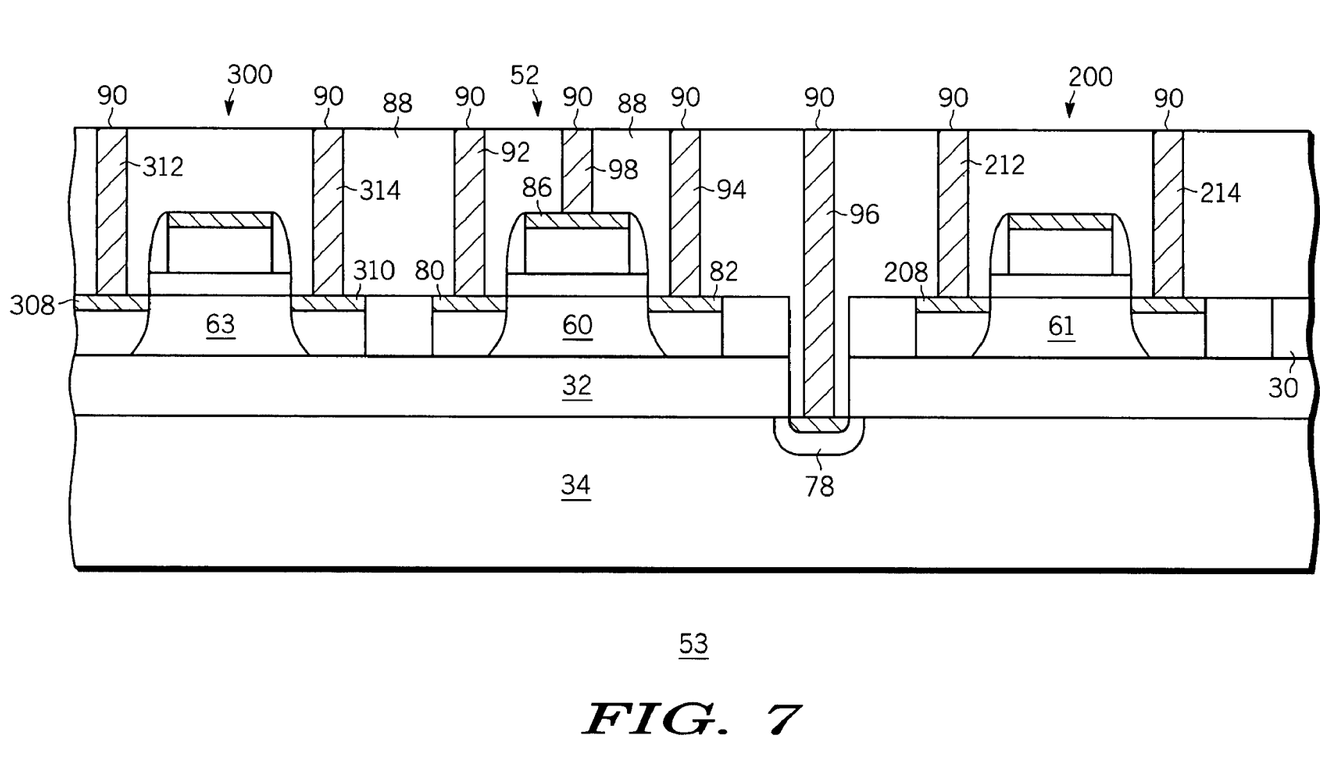

After removing the masking photoresist layer, the exposed portions of insulator layer 62 are removed and, in accordance with one embodiment of the invention, a layer of silicide forming metal such as nickel, cobalt, titanium, palladium, or the like is globally deposited onto the structure. The silicide forming metal is deposited in contact with the ion implanted contact regions 68, 70, and 78 and polycrystalline silicon top plate 64 of capacitor structure 52 as well as in contact with source 204 and drain 206 regions and gate electrode 202 of PMOS transistor 200 and drain 304 and source 306 regions and gate electrode 302 of NMOS transistor 300. The silicide forming metal preferably has a thickness of about 5-15 nm. The silicide forming metal is heated, preferably to a temperature of about 350°-500° C. to cause the metal to react with the silicon with which it is in contact to form a metal silicide contact regions 80, 82, and 84 on contact region 68, 70, and 78 respectively, a metal silicide contact 86 on polycrystalline silicon top plate 64, and metal silicide contacts 208 and 210 on MOS transistor 200 and 308 and 310 on MOS transistor 300, all as illustrated in FIG. 6. The metal that is not in contact with silicon, for example the metal that is deposited on the dielectric isolation regions, does not react during the heating step and is removed, for example by wet etching in a $H_2O_2$/$H_2SO_4$ or $HNO_3$/$HCl$ solution. Metal silicide contacts 209 and 309 to the gate electrodes of MOS transistors 200 and 300 may also be formed at the same time In accordance with an embodiment of the invention an interlayer dielectric material 88 such as silicon oxide is globally deposited and subsequently photolithographically patterned and etched to form openings 90 that expose portions of metal silicide contacts 80, 82, 84, 86, 208, 210, 308, and 310 as illustrated in FIG. 7. Interlayer dielectric material 88 can be deposited, for example, by CVD by the decomposition of a source material such as tetraethylorthosilicate (TEOS). Conductive plugs are formed in openings 90. Conductive plug 92 contacts metal silicide contact 80, conductive plug 94 contacts metal silicide contact 82, conductive plug 96 contacts metal silicide contact 84, and conductive plug 98 contacts metal silicide contact 86 of capacitor structure 52. In like manner, conductive plugs 212, 214, 312, and 314 contact metal silicide contacts, 208, 210, 308, and 310, respectively. The conductive plugs can be formed in conventional manner, for example by depositing a layer of titanium, forming a layer of titanium nitride, and then depositing a layer of tungsten. The excess plug material can be removed from the surface of interlayer dielectric material 88 by a CMP process.

Figure 8:
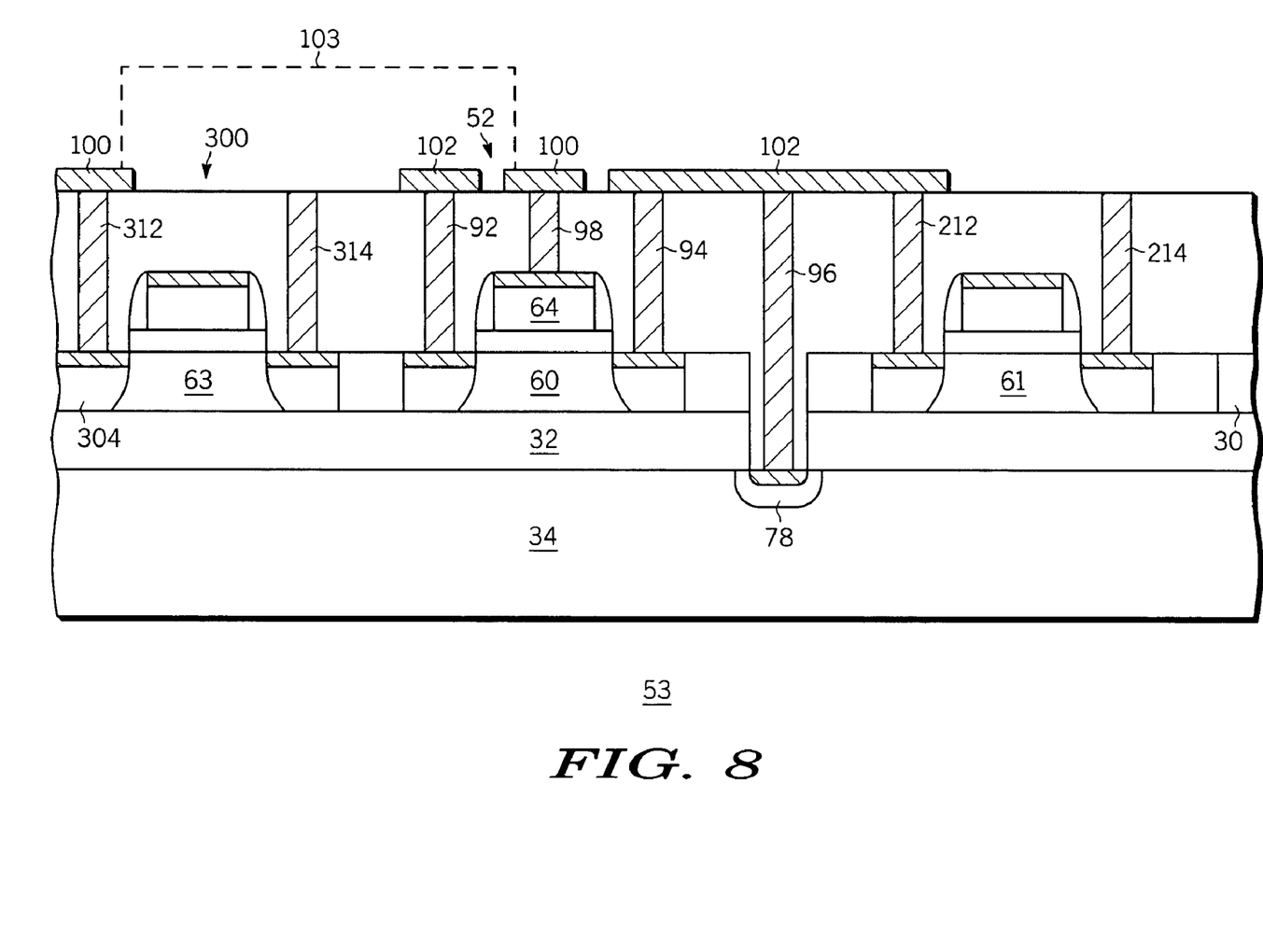

As illustrated in FIG. 8, the decoupling capacitor structure in accordance with an embodiment of the invention is completed by depositing and patterning a layer of metal to form a $V_{dd}$ bus 100 and a $V_{ss}$ bus 102. The layer of metal can be aluminum, copper, an alloy of aluminum or copper, or the like. The $V_{dd}$ bus is coupled to conductive plug 98 and hence to top plate 64 of decoupling capacitor 52. The $V_{ss}$ bus is coupled to conductive plugs 92 and 94 and hence to the bottom plate 60 of decoupling capacitor 52. The decoupling capacitor is thus coupled between the two voltage busses. In accordance with an embodiment of the invention, the $V_{ss}$ bus is also coupled to conductive plug 96 and hence to carrier substrate 34, providing an electrical discharge path for charge that may build up on the capacitor. At least for some of the MOS transistors of integrated circuit 53, the $V_{dd}$ bus is also coupled (as indicated by dotted line 103) to conductive plug 312 and hence to the drain of N-channel MOS transistor 300, and the $V_{ss}$ bus is also coupled to conductive plug 212 and hence to the drain of P-channel MOS transistor 200.

Figure 9:
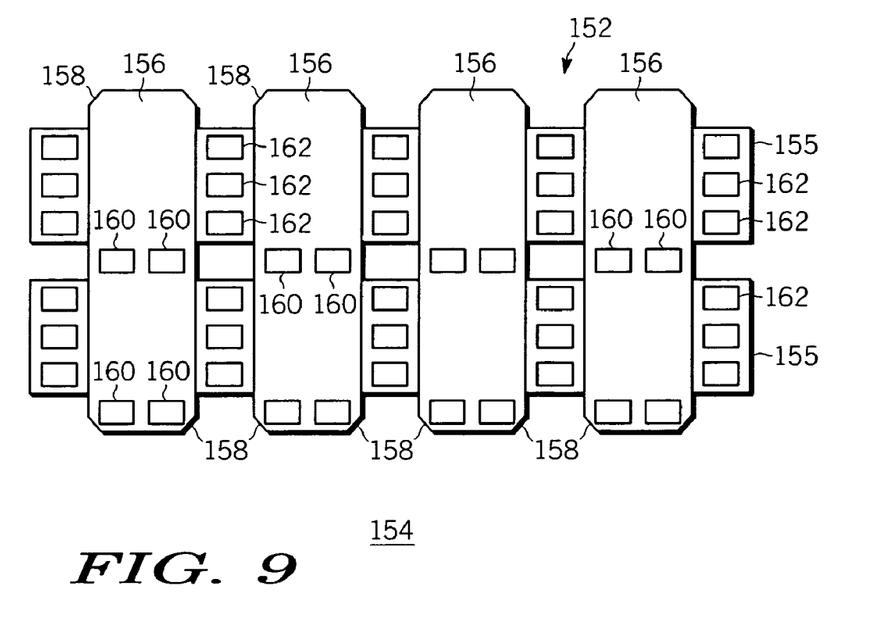
FIG. 9 illustrates, in plan view, a decoupling capacitor in accordance with a further embodiment of the invention

FIG. 9 illustrates, in plan view, a decoupling capacitor structure 152 in a portion of an integrated circuit 154 in accordance with a further embodiment of the invention by which the possibly destructive discharge of charge build up on the capacitor can be reduced. Decoupling capacitor structure 152 is formed in and overlying a monocrystalline silicon layer 30 that overlies a buried insulator layer 32 that, in turn, overlies a carrier substrate 34. Decoupling capacitor structure 152 and integrated circuit 154 can be formed by the same method steps illustrated in FIGS. 3 and 4 above. The N-type bottom plates of the capacitor structure are defined by the lines 155. The N+ contact regions, sidewall spacers, and MOS transistors are not illustrated in this figure. The top plate of the decoupling capacitor, in accordance with this embodiment of the invention is formed of a plurality of substantially rectangular shaped polycrystalline silicon plates 156 having chamfered corners 158. A first voltage bus such as a $V_{dd}$ bus (not illustrated in FIG. 9) is coupled to the top plate of capacitor structure 152 through contacts indicated by the number 160. A second voltage bus such as a $V_{ss}$ bus (not illustrated in FIG. 9) is coupled to the second plate of the capacitor structure through a plurality of contacts to the thin monocrystalline silicon layer indicated by the number 162. The $V_{dd}$ bus and the $V_{ss}$ bus can be coupled to the first and second plates of the capacitor structure in the same manner as those busses are coupled in illustrative FIG. 8. The chamfered corners reduce the field that would otherwise be produced at the corners of the plate by electrical charges that collect on the top plate of the capacitor. Although illustrated and described as "chamfered," the corners could also be rounded or otherwise radiused to achieve the same field lowering effect. Accordingly, it is intended that the term "chamfered" be interpreted herein to encompass such other corner shapes.

Figure 10:
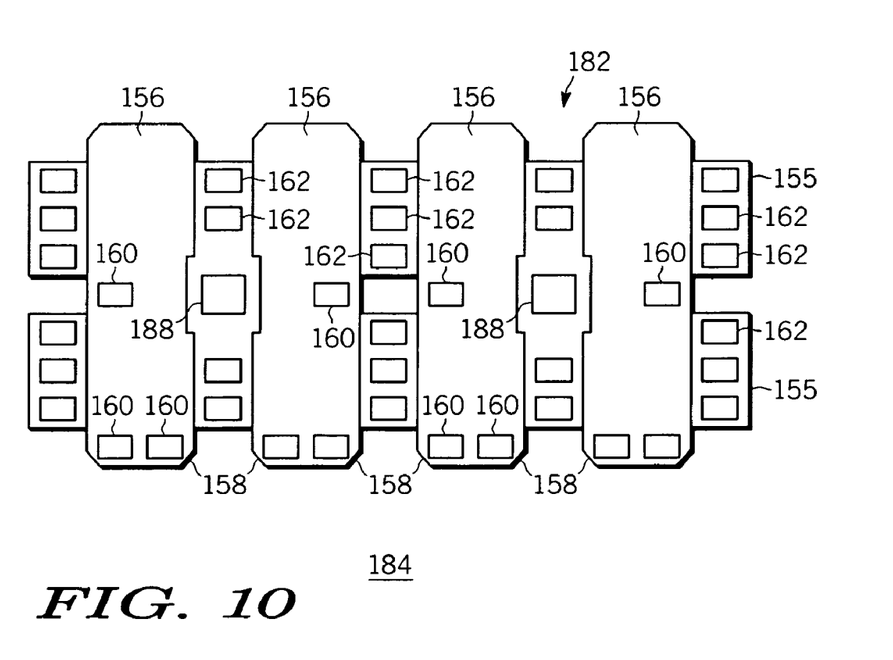
FIG. 10 illustrates, in plan view, a decoupling capacitor in accordance with yet another embodiment of the invention.

FIG. 10 illustrates, in plan view, a decoupling capacitor structure 182 in a portion of an integrated circuit 184 in accordance with yet a further embodiment of the invention. Decoupling capacitor structure 182 combines the advantages of the just described chamfered corners 158 of the plurality of substantially rectangular top plates 156 of the capacitor with a discharge path 186 formed in the same manner as described above and illustrated in FIGS. 3-8. Decoupling capacitor structure 182 is formed in and overlying a monocrystalline silicon layer 30 that overlies a buried insulator layer 32 that, in turn, overlies a carrier substrate 34. The plurality of top plates can be formed of polycrystalline silicon or other gate electrode forming material used to form the gate electrodes of MOS transistors of integrated circuit 184. The discharge path is formed by coupling the bottom plate of the capacitor to a P-type contact region 188 formed in carrier substrate 34. The bottom plate of the capacitor structure formed by an N-type region defined by lines 155 in the thin monocrystalline silicon layer is coupled to a first voltage bus such as a $V_{ss}$ bus (not illustrated in FIG. 10) through a plurality of contacts indicated by the number 162. The $V_{ss}$ bus and the bottom plate of the capacitor structure are also coupled to P-type contact region 188 formed in carrier substrate 34. The top plates 156 of the capacitor structure are coupled to a second voltage bus such as a $V_{dd}$ bus (not illustrated in FIG. 10) through a plurality of contacts indicated by the number 160. The $V_{dd}$ bus and the $V_{ss}$ bus can be coupled to the first and second plates of the capacitor structure in the same manner as those busses are coupled in illustrative FIG. 8.

While at least one exemplary embodiment has been presented in the foregoing detailed description, it should be appreciated that a vast number of variations exist. For example, the order of the method steps described above is illustrative only and is not intended to be limiting. Similarly, the enumerated metals, insulators, and ion species are illustrative only. Although the $V_{dd}$ bus and the $V_{ss}$ bus are illustrated in FIG. 7 as being formed on the same level in the integrated circuit, they may also be formed at different metallization levels. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a silicon on insulator (SOI) device comprising a silicon substrate, a buried insulator layer overlying the silicon substrate, and a monocrystalline silicon layer overlying the buried insulator layer, the method comprising the steps of:

forming a dielectric isolation region extending through the monocrystalline silicon layer;

etching an opening extending through the dielectric isolation region and the buried insulator region to expose a portion of the silicon substrate;

doping a portion of the silicon substrate exposed through the opening with a conductivity determining dopant of a first conductivity type;

doping a portion of the monocrystalline silicon layer with impurity dopants of a second conductivity type to form a first plate of a capacitor;

forming an insulator layer overlying the portion of the monocrystalline silicon layer;

forming a conductive electrode overlying the insulator layer to form a second plate of the capacitor;

coupling a first bus to the first plate of the capacitor and to the doped portion of the silicon substrate; and coupling a second bus to the second plate of the capacitor.

2. The method of claim 1 wherein the step of forming an insulator layer comprises the step of oxidizing the monocrystalline silicon layer to form a gate oxide.

3. The method of claim 2 wherein the step of forming a conductive electrode comprises the steps of:

depositing a layer of polycrystalline silicon; and patterning the layer of polycrystalline silicon to form a second plate of the capacitor, the gate electrode of a PMOS transistor, and the gate electrode of an NMOS transistor.

4. The method of claim 3 wherein the step of doping a portion of the silicon substrate further comprises the step of forming the source and drain regions of the PMOS transistor.

5. The method of claim 4 further comprising the step of ion implanting impurity determining ions to form a contact to the doped portion of the monocrystalline silicon layer and to form source and drain regions of the NMOS transistor.

6. A method for fabricating a silicon on insulator (SOI) integrated circuit comprising a silicon substrate, a buried insulator layer overlying the silicon substrate, and a monocrystalline silicon layer overlying the buried insulator layer, the method comprising the steps of:

impurity doping a portion of the monocrystalline silicon layer to form a first capacitor plate;

forming a gate insulator layer overlying the portion of the monocrystalline silicon layer;

depositing a layer of polycrystalline silicon overlying the gate insulator layer;

patterning the layer of polycrystalline silicon to form a second capacitor plate having a substantially rectangular shape with chamfered corners;

ion implanting impurity determining ions into the monocrystalline silicon layer in self alignment with the second capacitor plate to form a contact to the first capacitor plate;

forming a first voltage bus coupled to the first capacitor plate; and forming a second voltage bus coupled to the second capacitor plate.

7. The method of claim 6 further comprising the steps of:
forming an impurity doped contact to the silicon substrate; and
coupling the first voltage bus to the impurity doped contact.

8. The method of claim 7 wherein the step of forming an impurity doped contact comprises the steps of:
forming a dielectric isolation region extending through the monocrystalline silicon layer;
etching an opening extending through the dielectric isolation region and the buried insulator layer to expose a portion of the silicon substrate; and
ion implanting impurity determining ions through the opening and into the silicon substrate.

9. A method for fabricating a silicon on insulator (SOI) device comprising a silicon substrate, a buried insulator layer overlying the silicon substrate, and a monocrystalline silicon layer overlying the buried insulator layer, the method comprising the steps of:
impurity doping a portion of the monocrystalline silicon layer to form a first capacitor plate;
forming a gate insulator layer overlying the portion of the monocrystalline silicon layer;
depositing a layer of gate electrode material overlying the gate insulator layer;
patterning the layer of gate electrode material to form a second capacitor plate having a substantially rectangular shape with chamfered corners;
ion implanting impurity determining ions into silicon substrate to form a substrate contact;
forming a first voltage bus coupled to the first capacitor plate and to the substrate contact; and
forming a second voltage bus coupled to the second capacitor plate.

10. The method of claim 9 further comprising the steps of:
forming a plurality of dielectric isolation regions extending through the monocrystalline silicon layer and electrically isolating the portion of the monocrystalline silicon layer from a second portion of the monocrystalline silicon layer and from a third portion of the monocrystalline silicon layer;
etching an opening through one of the plurality of dielectric isolation regions and the buried insulator layer to expose a portion of the silicon substrate; and
wherein the step of ion implanting impurity determining ions comprises the step of ion implanting impurity determining ions through the opening.

11. The method of claim 10 further comprising the steps of forming an NMOS transistor in the second portion and forming a PMOS transistor in the third portion.

12. The method of claim 11 wherein the step of ion implanting further comprises the step of forming source and drain regions of the PMOS transistor.

13. The method of claim 11 further comprising the step of ion implanting N-type impurity determining ions to form source and drain regions of the NMOS transistor and contacts to the impurity doped portion of the monocrystalline silicon layer.

14. The method of claim 11 further comprising the steps of:
coupling the first voltage bus to the PMOS transistor; and
coupling the second voltage bus to the NMOS transistor.

15. A method for fabricating a silicon on insulator (SOI) device comprising a silicon substrate, a buried insulator layer overlying the silicon substrate, and a monocrystalline silicon layer overlying the buried insulator layer, the method comprising the steps of:
forming an MOS capacitor coupled between a first voltage bus and a second voltage bus, the MOS capacitor having a gate electrode material forming a first plate of the MOS capacitor and coupled to the first voltage bus and an impurity doped region in the monocrystalline silicon layer beneath the gate electrode material forming a second plate of the MOS capacitor and coupled to the second bus; and
forming an electrical discharge path coupling the second plate of the MOS capacitor to the silicon substrate, wherein the step of forming an electrical discharge path comprises the steps of:
forming a dielectric isolation region extending through the monocrystalline silicon layer to the buried insulator layer;
etching an opening through the dielectric isolation region and the buried insulation layer to expose a portion of the silicon substrate;
ion implanting conductivity determining impurities through the opening to form an electrical contact area in the substrate; and
coupling the second voltage bus to the electrical contact area in the substrate.

16. The method of claim 15 wherein the step of forming an MOS capacitor comprises the steps of:
forming a gate insulator layer overlying the monocrystalline silicon layer;
depositing a layer of gate electrode material comprising polycrystalline silicon overlying the gate insulator layer; and
patterning the gate electrode material to form a plurality of substantially rectangular first capacitor plates each having chamfered corners.

17. The method of claim 16 further comprising the step of ion implanting impurity determining ions into the monocrystalline silicon layer to form doped contacts to the second plate of the MOS capacitor, each contact in self alignment with one of the plurality of substantially rectangular first capacitor plates.

18. A method for fabricating a silicon on insulator (SOI) integrated circuit comprising a silicon substrate, a buried insulator layer overlying the silicon substrate, and a monocrystalline silicon layer overlying the buried insulator layer, the method comprising the steps of:
forming a plurality of isolation structures extending through the monocrystalline silicon layer to the buried insulator layer to form a plurality of electrically isolated regions in the monocrystalline silicon layer;
doping a first electrically isolated region and a second electrically isolated region of the plurality of electrically isolated regions with N-type conductivity determining dopant impurities;
doping a third electrically isolated region of the plurality of electrically isolated regions with P-type conductivity determining dopant impurities;
etching an opening through one of the plurality of isolation structures and the buried insulator layer to expose a portion of the silicon substrate;
forming a gate insulator layer overlying the first electrically isolated region, the second electrically isolated region and the third electrically isolated region;
forming a first gate electrode overlying the gate insulator overlying the first electrically isolated region, a conductive capacitor electrode overlying the gate insulator overlying the second electrically isolated region, and a second gate electrode overlying the gate insulator overlying the third electrically isolated region;
ion implanting P-type conductivity determining dopant ions to form P-type source and drain regions of a PMOS transistor self aligned with the first gate electrode in the first electrically isolated region and a P-type contact in the exposed portion of the silicon substrate;

ion implanting N-type conductivity determining dopant ions to form N-type source and drain regions of an NMOS transistor self aligned with the second gate electrode in the third electrically isolated region and to form a second capacitor contact self aligned with the conductive capacitor electrode in the second electrically isolated region; and forming a first bus conductor coupled to the conductive capacitor electrode and to the drain of the NMOS transistor and a second bus conductor coupled to the second capacitor contact, the P-type contact in the exposed portion of the silicon substrate, and the drain of the PMOS transistor.

19. The method of claim 18 wherein the step of forming a conductive capacitive electrode comprises the steps of:

depositing a layer of conductive material; and patterning the layer of conductive material to form a substantially rectangular capacitor electrode having chamfered corners.

* * * * *